United States Patent
Grivna et al.

(10) Patent No.: US 7,282,406 B2
(45) Date of Patent: Oct. 16, 2007

(54) METHOD OF FORMING AN MOS TRANSISTOR AND STRUCTURE THEREFOR

(75) Inventors: Gordon M. Grivna, Mesa, AZ (US); Francine Y. Robb, Fountain Hills, AZ (US)

(73) Assignee: Semiconductor Companents Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/367,627

(22) Filed: Mar. 6, 2006

(65) Prior Publication Data
US 2007/0207582 A1    Sep. 6, 2007

(51) Int. Cl.
*H01L 21/8242* (2006.01)

(52) U.S. Cl. .................. 438/247; 438/252; 438/256; 438/270

(58) Field of Classification Search .......... 438/247, 438/252, 256, 270
See application file for complete search history.

(56) References Cited

U.S. PATENT DOCUMENTS

| | | | |
|---|---|---|---|
| 4,847,522 A | 7/1989 | Fuller et al. | |
| 4,967,245 A | 10/1990 | Cogan et al. | |
| 5,021,845 A * | 6/1991 | Hashimoto | 257/331 |
| 5,877,527 A | 3/1999 | Okabe et al. | |
| 6,017,798 A * | 1/2000 | Ilderem et al. | 438/286 |
| 6,084,264 A | 7/2000 | Darwish | |
| 6,351,009 B1 | 2/2002 | Kocon et al. | |
| 6,624,469 B1 | 9/2003 | Harada | |
| 6,661,277 B2 | 12/2003 | Dabral | |
| 6,777,745 B2 | 8/2004 | Hshieh et al. | |
| 6,916,712 B2 | 7/2005 | Kocon et al. | |
| 6,943,408 B2 | 9/2005 | Wu et al. | |

OTHER PUBLICATIONS

"Trench Power MOSFET Having Low Gate Charge", Published at http://ip.com/pubView/IPCOM000021950D on Feb. 17, 2004.

* cited by examiner

*Primary Examiner*—Mary Wilczewski
*Assistant Examiner*—Seth Barnes
(74) *Attorney, Agent, or Firm*—Robert F. Hightower

(57) ABSTRACT

In one embodiment, an MOS transistor is formed with trench gates. The gate structure of the trench gates generally has a first insulator that has a first thickness in one region of the gate and a second thickness in a second region of the gate.

16 Claims, 10 Drawing Sheets

METHOD OF FORMING AN MOS TRANSISTOR AND STRUCTURE THEREFOR

This application is related to an application entitled "BI-DIRECTIONAL TRANSISTOR WITH BY-PASS PATH AND METHOD THEREFOR" that is filed concurrently herewith having at least one common inventor, a common assignee, and having an application Ser. No. 11/367,626. This application is also related to an application entitled "BI-DIRECTIONAL TRANSISTOR AND METHOD THEREFOR" filed on Mar. 31, 2005, having an application Ser. No. 11/093,381, having at least one common inventor, and a common assignee.

BACKGROUND OF THE INVENTION

The present invention relates, in general, to electronics, and more particularly, to methods of forming semiconductor devices and structure.

In the past, portable electronic systems often were powered by multiple power sources such as one of two batteries or from a battery and an AC wall outlet via an ac/dc converter or battery charger. A network of switches generally was used to control the flow of power depending on the mode of operation. For instance, if the portable device was powered from a primary battery while a secondary battery was charged, some switches were closed while other switches were open. In another mode, the switches may have been reversed. To be effective in all modes, the switches should have conducted and blocked in both directions. However, power metal oxide semiconductor field effect transistors (power MOSFETs) could only block voltage in one direction. In the reverse direction, the body diode of the MOSFET conducted current, thus, two power MOSFETs typically were connected in series to function as one switch. The two power MOSFETS typically were used with their drains tied together so that when the gate voltage was zero, one of the devices would always block the voltage applied across the two transistors regardless of the polarity. One example of such a switch was the NTLTD7900 offered by ON Semiconductor of Phoenix Ariz. Because such switches used two transistors, the switches used twice as much silicon as one transistor which increased the costs. Additionally, the on-resistance was high because the two transistors were in series.

Accordingly, it is desirable to have a method of forming a bi-directional switch that has a high breakdown voltage in both directions, that reduces the on-resistance of the bi-directional switch, and that reduces costs.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
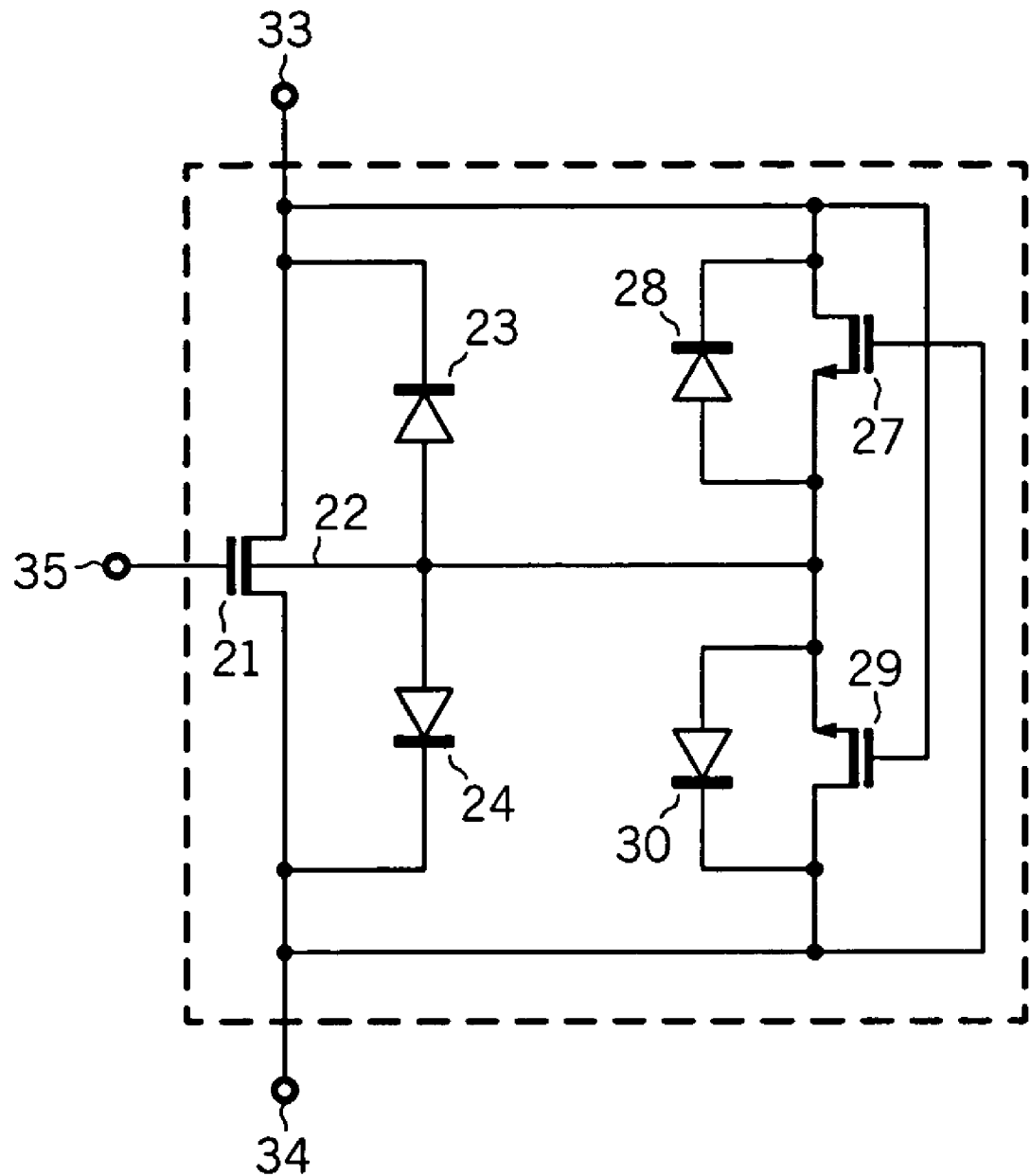
FIG. 1 schematically illustrates a circuit representation of a portion of an embodiment of an MOS transistor in accordance with the present invention.

FIG. 1 schematically illustrates a circuit representation of a bi-directional transistor 20 that can conduct current in both directions through transistor 20 and block reverse voltages in both directions across transistor 20. Transistor 20 includes a first MOS transistor 21, a first switch or first switch transistor 27, and a second switch or second switch transistor 29. A parasitic source-drain diode of transistor 27 is illustrated by a diode 28, and a parasitic source-drain diode of transistor 29 is illustrated by a diode 30. Transistor 20 also includes a control terminal 35 that is configured to provide connection to a control electrode or gate of transistor 20, a first current terminal 33 that is configured to provide connection to a first carrying electrode (CCE1) of transistor 20, and a second current terminal 34 that is configured to provide connection to a second carrying electrode (CCE2) of transistor 20. The first and second current carrying electrodes can function as the source and drain of transistor 20 as will be seen further hereinafter. Although transistors 20, 21, 27, and 29 are illustrated and described herein as N-channel transistors, transistor 20 and transistors 21, 27, and 29 may also be implemented as P-channel transistors. As will be seen further hereinafter, transistor 21 includes a body region or body 22 that is isolated from both current carrying electrodes of transistor 21. In order to facilitate the bi-directional current conduction through transistor 20, body 22 is not directly connected to either current carrying electrode of transistor 21 but is selectively coupled to either of the current carrying electrodes (CCE1 and CCE2) by transistors 27 and 29 responsively to the signals that are applied on the first current carrying electrode and the second current carrying electrode of transistor 20. The source of a transistor typically is the electrode connected to the body of the transistor. Because body 22 is not directly connected to either the source or the drain of transistor 21, it is not clear in the circuit schematic representation of transistor 20 which current carrying electrode of transistor 20 is identified as the source or the drain of transistor 20.

In operation, if the voltage of the signal applied to the second current carrying electrode through terminal 34 is greater than the voltage of the signal applied to the first current carrying electrode through terminal 33, then the second current carrying electrode functions as the drain and the first current carrying electrode functions as the source of transistors 20 and 21. If the voltage applied to terminal 35 relative to the voltage applied to terminal 33 is less than the threshold voltage of transistor 21, transistor 21 is in an off state. The gate of transistor 29 is at a low voltage, thus, transistor 29 is also off. The gate of transistor 27 is at the voltage that is applied to terminal 34. Assuming that the voltage applied to terminal 34 is greater than the threshold of transistor 27, transistor 27 is turned-on and couples body 22 to the first current carrying electrode thereby ensuring that body 22 is connected to the lowest voltage that is applied to transistor 20. This facilitates transistor 20 withstanding the voltage applied between terminals 33 and 34. If the voltage applied to terminal 35 is changed to be greater than the threshold voltage of transistor 21, transistor 21 is on, thus, the voltage on terminal 34 is substantially the same as the voltage applied to terminal 33 (minus the Vds-on of transistor 21). Consequently, the voltage applied to the gate of transistors 27 and 29 is also low and both of transistors 27 and 29 are off. Body 22 is floating but, due to diode 28, will never be more that about 0.6 V greater than the voltage on terminal 33. Since transistor 21 is on, current can flow from terminal 34 through transistor 21 to terminal 33. Because transistor 20 is on, transistor 21 does not have to block voltages applied between the first and second current carrying electrodes thus the connection of body 22 is not important.

If these signals applied to terminals 33 and 34 are reversed such that the highest voltage is applied to CCE1 through terminal 33 and the lower voltage is applied to CCE2 through terminal 34, then the second current carrying electrode functions as the source and the first current carrying electrode functions as the drain of transistors 20 and 21. If the voltage applied to terminal 35 is again less than the threshold voltage of transistor 21 relative to the voltage applied to terminal 34, then transistor 21 is off. The gate of transistor 27 receives the low voltage from terminal 34, thus transistor 27 is off. The gate of transistor 29 receives the high voltage from terminal 33 which enables transistor 29 to connect body 22 to the second current carrying electrode and to the lowest voltage applied to transistor 20. This connection facilitates transistor 20 withstanding the voltage applied between CCE1 and CCE2 through terminals 33 and 34. If the voltage applied to terminal 35 is changed to be greater than the threshold voltage of transistor 21, transistor 21 is on and current flow is enabled from terminal 33 through transistor 21 to terminal 34. Because transistor 21 is turned-on, the voltage on terminal 33 is substantially the same as the voltage applied to terminal 34 (minus the Vds-on of transistor 21). Consequently, the voltage applied to the gate of transistors 27 and 29 is also low and both of transistors 27 and 29 are off. Body 22 is floating but, due to diode 30, will never be more that about 0.6 V greater than the voltage on terminal 34. Since transistor 21 is turned-on, transistor 21 does not have to block voltages thus the connection of body 22 is not important.

In order to assist in providing this functionality for transistor 20, a drain of transistor 27 is commonly connected to the gate of transistor 29 and the first current carrying electrode of transistors 20 and 21. A source of transistor 27 is commonly connected to body 22 and to a source of transistor 29. A drain of transistor 29 is commonly connected to the gate of transistor 27 and to the second current carrying electrode of transistors 20 and 21.

Figure 2:
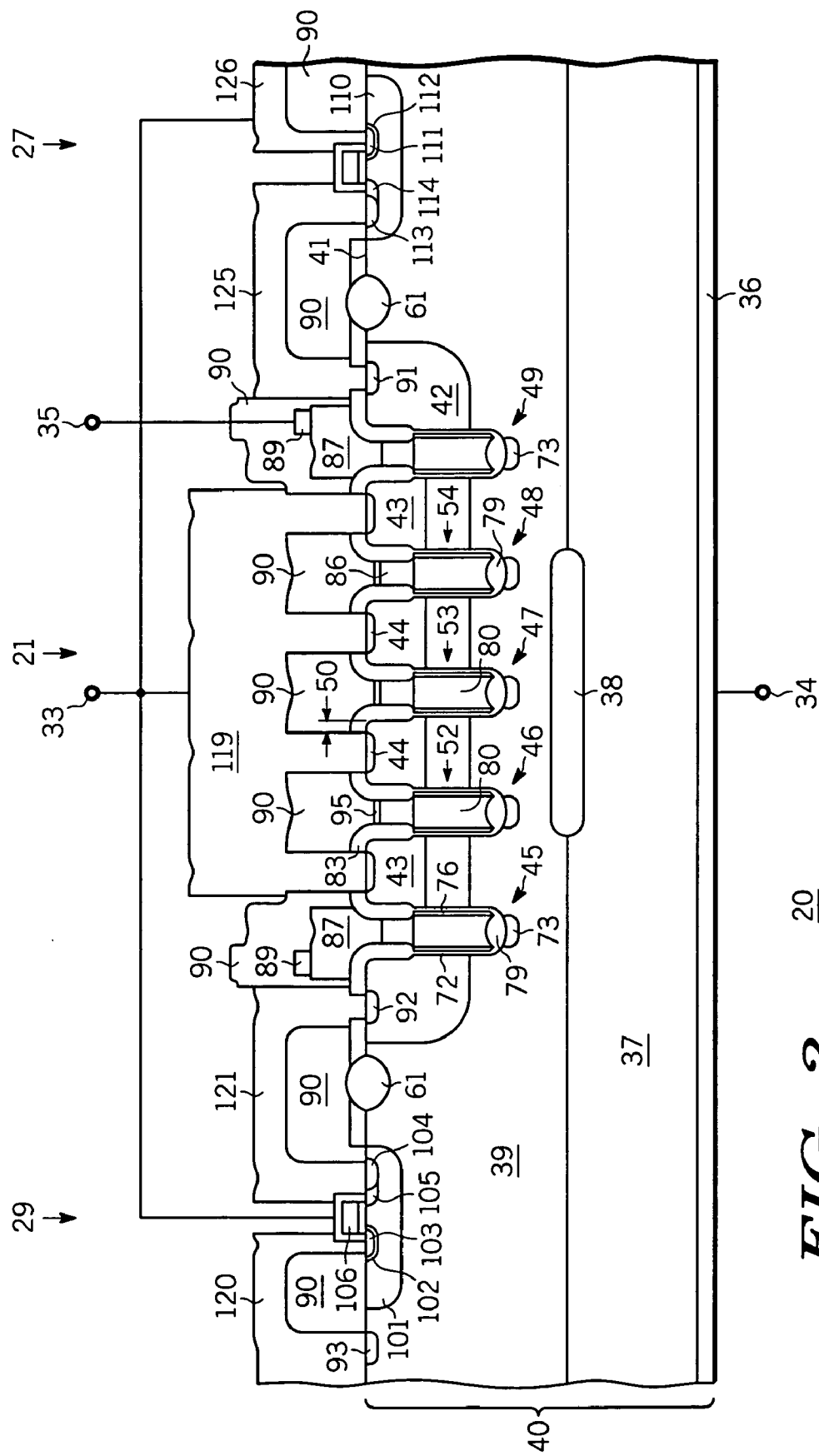
FIG. 2 illustrates a cross-sectional portion of the embodiment of the MOS transistor of FIG. 1 in accordance with the present invention.

FIG. 2 illustrates an enlarged cross-sectional portion of the embodiment of transistor 20 illustrated in FIG. 1.

Figure 3:
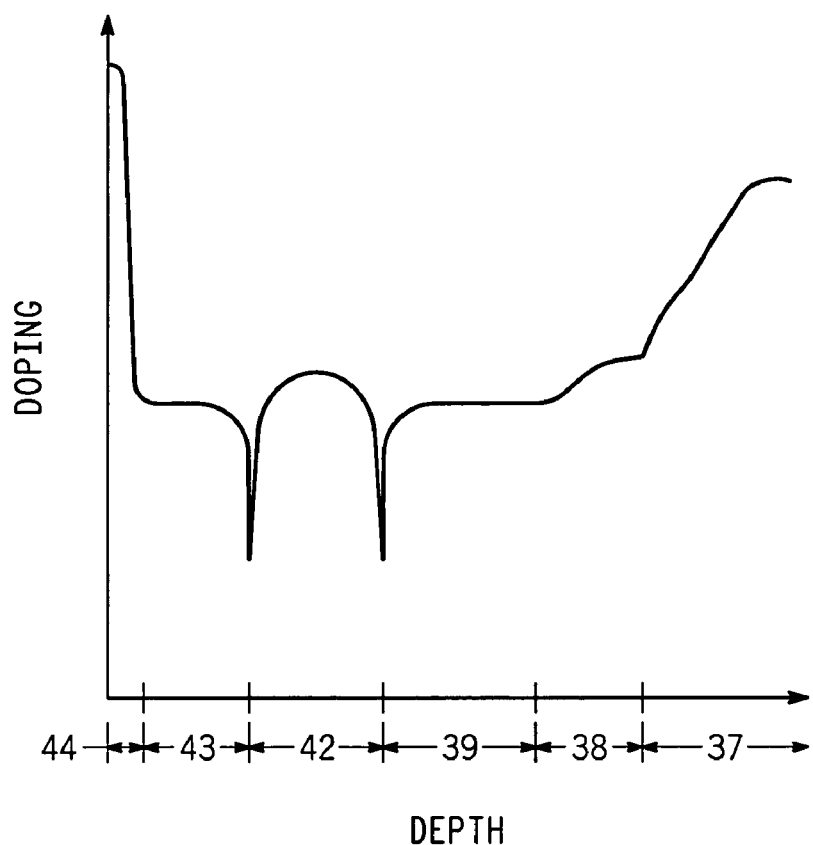
FIG. 3 is a graph having a plot that illustrates an embodiment of a doping profile of some of the regions of the MOS transistor of FIG. 1 in accordance with the present invention.

FIG. 3 is a graph having a plot that illustrates one embodiment of a doping profile of some of the regions of transistor 20 versus the depth of the dopant into transistor 20. The abscissa illustrates the depth and is labeled to illustrate some of the regions of transistor 20 encountered as the depth increases. The ordinate illustrates the doping concentration. This description has references to FIG. 1, FIG. 2, and FIG. 3. In one embodiment, transistor 21 is an N-channel vertical MOSFET that has trench type gates and transistors 27 and 29 are lateral N-channel transistors. In this embodiment, transistor 21 has multiple trench gates 45-49 that typically extend parallel to each other across a semiconductor substrate 40. For the cross-section illustrated in FIG. 2, those skilled in the art will appreciate that the multiple trench gates generally would extend in a direction perpendicular to the plane of the page, however any number of geometrical variations for the trench gates are possible. In some embodiments, electrical contact is made to the gates distal to the portion of transistors 21 illustrated in FIG.2. Substrate 40 typically includes a bulk N-type substrate 37 and an N-type epitaxial layer 39 that is formed on a surface of bulk substrate 37. Transistors 21, 27, and 29 are formed on a first surface 41 of substrate 40. A conductor 36 is formed on a second surface of substrate 37 and functions to provide a connection between CCE2 and terminal 34.

Transistors 21, 27, and 29 are formed on substrate 40. Transistor 21 includes a first doped region 42 that is formed on first surface 41 of substrate 40 and extends a first distance into substrate 40. Region 42 functions as body 22 of transistor 21 and has a conductivity type that is opposite to the conductivity type of layer 39. The peak doping concentration of region 42 generally is no less than the peak doping concentration of layer 39 in order to provide a channel region and to block forward voltages applied to transistor 20. Region 42 may be doped with boron at a peak concentration between about 1E16 to 1E18 atoms/cm$^3$ to facilitate transistor 20 sustaining a forward breakdown voltage of at least about ten to fifty volts (10-50 V). Region 42 and layer 39 assist in blocking forward voltages applied to transistor 20 such as when the voltage applied to terminal 34 is greater than the voltage applied to terminal 33. Region 42 often is referred to as a pHV region. A doped region 91 and a doped region 92 are formed within region 42 in order to facilitate making electrical contact to region 42. Regions 91 and 92 typically are the same conductivity type as region 42 and have a higher doping concentration. Although only one region 91 and one region 92 are shown, those skilled in the art will appreciate that more regions 91 and 92 may be used including forming such regions interspersed between gates 45-49. The P-N junction formed at the interface between region 42 and layer 39 forms a diode that is illustrated as diode 24 in FIG. 1. Other high voltage regions, also referred to as nHV regions, are formed to assist in blocking reverse voltages such as when the voltage applied to terminal 33 is greater than the voltage applied to terminal 34. Such high voltage regions are formed as doped regions 43 that extend from surface 41 a second distance into region 42 and overlie at least a portion of region 42. The second distance of regions 43 has to be deep enough to support the high reverse voltages. As illustrated by FIG. 3, regions 43 generally have a doping concentration that is less than the doping concentration of region 42 in order to provide a high reverse breakdown voltage between region 42 and regions 43 and also provide a threshold voltage of about 0.5 volts to 2.0 volts for the MOS transistor formed by layer 39 and regions 42 and 43 of transistor 21. Regions 43 may have a peak doping concentration of about 1E16 to 1E18 atoms/cm$^3$ to facilitate transistor 20 sustaining a reverse breakdown voltage of at least about ten to fifty volts (10-50 V). A P-N junction formed at the interface between regions 43 and 42 forms another diode that is illustrated as diode 23 in FIG. 1. Trenches are formed extending from surface 41 through regions 42 and 43 into layer 39 in order to form trench type gates 45, 46, 47, 48, and 49 for transistor 21. Gates 45-49 are identified in general by arrows. Forming the trenches through region 43 divides region 43 into a plurality of regions 43. The gate structure of gates 45-49 include a first insulator, such as a first silicon dioxide 72 (sometimes referred to as oxide 72), and a second insulator, such as a second silicon dioxide 83, are formed along the sidewalls of each trench. Silicon dioxide 72 or silicon dioxide 83 may be referred to herein as oxide 72 or oxide 83, respectively. The first insulator functions as a gate dielectric for gates 45-49. The gate dielectric generally is along the sidewalls of the trench and juxtaposed to region 42. The thicker second insulator assists in sustaining a high electric field thereby increasing the reverse breakdown voltage of transistor 20. An optional third insulator, such as a thick bottom silicon dioxide 79, is formed along the bottom of each trench. The third insulator along the bottom of each trench usually is thicker than the first insulator in order to assist in reducing the gate to CCE2 capacitance of transistor 21 and also sustain a greater voltage across silicon dioxide 79. A gate conductor 80 is formed within each trench in order to assist in forming gates 45-49. In the preferred embodiment, conductor 80 is doped polysilicon but may be other conductor materials in other embodiments. Conductor 80 typically is covered with another insulator 95. A doped region 44 is formed on the surface of substrate 40 and disposed between trench gates 45-49. Region 43 generally functions as the first current carrying electrode (CCE1) for transistor 21 and region 44 functions to assists in making a low resistance electrical contact thereto. Regions 44 are opposite in conductivity to region 42 and have a higher doping concentration (See FIG. 3) than regions 42 and 43. The higher doping concentration assists in making an ohmic contact to region 43. Regions 44 may be doped with arsenic to a peak doping concentration between about 1E18 and 1E21 atoms/cm$^3$. Regions 44 are formed on surface 41 and extend a third distance into substrate 40 that is less than the second distance of regions 43 in order to overlie a portion of regions 43. Regions 43 generally are formed before regions 44 and a portion of regions 43 may be over doped to form regions 44. Regions 44 typically are spaced a first distance 50 from the vertical portion of the sidewall of each of the trenches that form gates 45-49. Distance 50 assists in reducing the gate-to-CCE1 capacitance and assists in reducing the electric field across oxide 83 thereby increasing the drain-to-source reverse breakdown of transistor 21. It also assists in allowing a wider lateral depletion region.

A transistor without regions 43 would be able to sustain only a very small reverse voltage, typically less than about eight volts (8 V). However, because of regions 43 transistor 20 can sustain a large reverse voltage. Thus, it can be seen that transistor 20 includes a first blocking junction (such as at the interface of regions 42 and 43) that blocks voltage applied in a first direction across transistor 20 and a second blocking junction (such as at the interface of layer 39 and region 42) that blocks voltages applied in a second direction across transistor 20.

In one embodiment, region 42 has a peak doping concentration of about 9E16 atoms/cm$^3$ and the junction between region 42 and layer 39 is about 2.8 microns from surface 41. Region 43 has a peak doping concentration of about 5E16 atoms/cm$^3$ and the junction between regions 42 and 43 is about 1.5 microns from surface 41. These parameters assist in providing transistor 20 with a reverse breakdown voltage, generally between regions 43 and 42, that is greater than twenty volts (20V) and generally is about thirty volts (30V), and a forward breakdown voltage, generally between region 42 and layer 39, that is greater than twenty-five volts and generally is about thirty volts (30V). Region 44 is spaced about 0.3 microns from the vertical sidewalls of gates 45-49 which allows a wider depletion and also reduces the electric field by about sixty percent in the second insulator thereby assisting in increasing the reverse breakdown voltage of transistor 20.

Transistor 29 may be formed on surface 41 adjacent one side of transistor 21. In the preferred embodiment, transistor 29 includes a doped region 101 that extends across the first surface of substrate 40. Region 101 may be positioned parallel to region 42 or may be positioned differently in other embodiments. Region 101 functions as the body of transistor 29 and typically has a conductivity that is opposite to layer 39. A doped region 102 is formed within region 101 and has an opposite conductivity type in order to function as the drain of transistor 29. A doped region 103 is formed within region 102 and has the same conductivity at a higher doping concentration than region 102 in order to facilitate forming electrical contact to region 102. A doped region 105 having a conductivity type and doping concentration similar to region 103 is formed within region 101 and spaced apart from region 102 in order to function as the source of transistor 29. A doped region 104 which has the same conductivity type as region 101 is formed abutting region 104 to assist in forming electrical contact to region 101. A gate 106 of transistor 29 includes a gate insulator that is formed on the surface of substrate 40 and overlying a portion of at least regions 103 and 105, a gate conductor that is formed overlying the gate insulator, and a dielectric that covers the gate conductor to insulate the gate conductor from other conductors.

A doped region 93 may be formed on surface 41 adjacent to region 101 extending into layer 39 in order to form electrical contact to layer 39. Region 93 may extend parallel to region 101 but may be positioned differently in other embodiments. Region 93 generally has a conductivity type that is the same as layer 39 and a higher doping concentration. Region 93 facilitates forming electrical contact between the drain of transistor 29 and CCE2 of transistor 21.

Transistor 27 may be formed on surface 41 adjacent another side of transistor 21. Transistor 27 generally includes a doped region 110 that is similar to doped region 101. Doped region 110 may extend parallel to a side of transistor 21 or may be positioned differently. A doped region 111 is formed to extend from surface 41 into region 110 similarly to region 102 and forms the drain of transistor 27. A doped region 112 is formed within region 111 similarly to region 103 to facilitate forming electrical contact to region 111. A doped region 114, that is similar to doped region 105, is form within region 110 and spaced apart from region 111 to function as the source of transistor 27. A doped region 113, that is similar to region 104, is formed abutting region 113 and facilitates forming low resistance electrical contact to region 110. The doping type and concentration of regions 113, 114, 111, and 112 usually are similar to respective regions 104, 105, 102, and 103.

Figure 4:
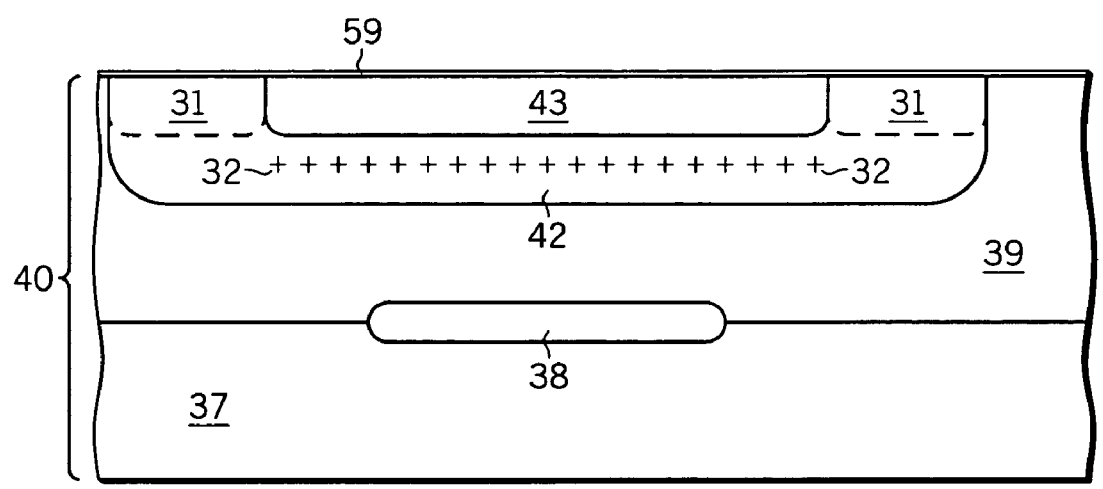
FIG. 4 illustrates an enlarged cross-sectional portion of the MOS transistor of FIG. 1 illustrating portions of an early stage of an embodiment of a method of forming the MOS transistor in accordance with the present invention.

FIG. 4 illustrates an enlarged cross-sectional portion of transistor 20 illustrating portions of an early stage of an embodiment of a method of forming transistor 21 of transistor 20. This description has references to FIG. 2, FIG. 3, and FIG. 4. A region of substrate 40 is used for forming transistor 21. Other sections of substrate 40 are used to form transistors 27 and 29, however, such sections are not illustrated in this description for clarity of the description. Other regions of substrate 40 may be used for other types of devices. Substrate 40 generally includes bulk semiconductor substrate 37 that has epitaxial layer 39 formed on one surface of substrate 37. However, in some embodiments epitaxial layer 39 may not be required and transistor 20 may be formed on bulk semiconductor substrate 37, such as in a doped region of substrate 37. In such a case, a top surface of substrate 37 would become surface 41. In most embodiments, a buried layer 38 is formed in a portion of substrate 40 that underlies a portion of transistor 21. Buried layer 38 may be formed by a variety of well-known methods including doping substrate 40 with a high energy implant or by doping a portion of substrate 37 prior to forming layer 39. Buried layer 38 under the gates of transistor 21 allows using lighter doping in layer 39 which assists in forming regions 101 and 110 within layer 39.

A first insulating layer 59, such as a pad oxide formed typically of silicon dioxide, is formed on surface 41 of substrate 40 to a thickness of approximately 400-1000 angstroms. Layer 59 may be formed by a variety of well know methods including thermal oxidation. A mask (not shown) may be used to assist in doping a portion of surface 41 to form doped region 43 within substrate 40. Region 43 generally is formed by a high energy implant in order to achieve the desired doping concentration at the depth described hereinbefore. For example, phosphorous may be implanted at a dose of approximately 1E12 to 1E13 atoms/$cm^2$ with an energy of approximately two hundred to eight hundred (200-800) Kev. A drive at approximately one thousand to eleven hundred (1000-1100) degrees Celsius for about sixty (60) minutes may be used to activate the dopants. Thereafter, region 42 may be formed with region 43 overlying a portion of region 42. In the preferred embodiment, region 42 is formed by first implanting dopants within layer 39 with the peak doping concentration at a depth that is deeper than the depth of region 43. The implanted dopants are illustrated in FIG. 4 by plus signs (+) 32. The dopants illustrated by plus signs 32 may be formed by a high energy implant in order to achieve the desired doping concentration at the depth described hereinbefore. For example, boron may be implanted at a dose of approximately 8E12 to 1E14 atoms/$cm^2$ with an energy of approximately five hundred (500) Kev to two (2) Mev. A drive at approximately nine hundred to one thousand (900-1000) degrees Celsius for about sixty (60) minutes may be used to activate the dopants. Thereafter, portions 31 of layer 39 adjacent to region 43 and overlying the dopants illustrated by plus signs 32 are doped to ensure that region 42 extends from surface 41 to the desired depth of the peak doping concentration. Portions 31 are illustrated in a general manner by dashed lines. The peak doping concentration of portions 31 generally is 1E18 to 1E20 atoms/$cm^3$ and preferably is about 1E19 atoms/$cm^3$. Portions 31 generally are implanted at a lower energy in order to form the peak doping closer to surface 41 than the dopants of plus signs 32. For example, portions 31 may be implanted at a dose of about 1E14 to 5E15 atoms/$cm^2$ at an energy of about sixty (60) Kev. Other methods may also be used to form region 42, such as multiple epitaxial layers and associated doping of the epitaxial layers to achieve region 42. However, the high energy implantation method provides good control of the depth and doping concentration of region 42 and is preferable. Thus, region 43 is positioned overlying a portion of region 42 and within region 42.

Figure 5:
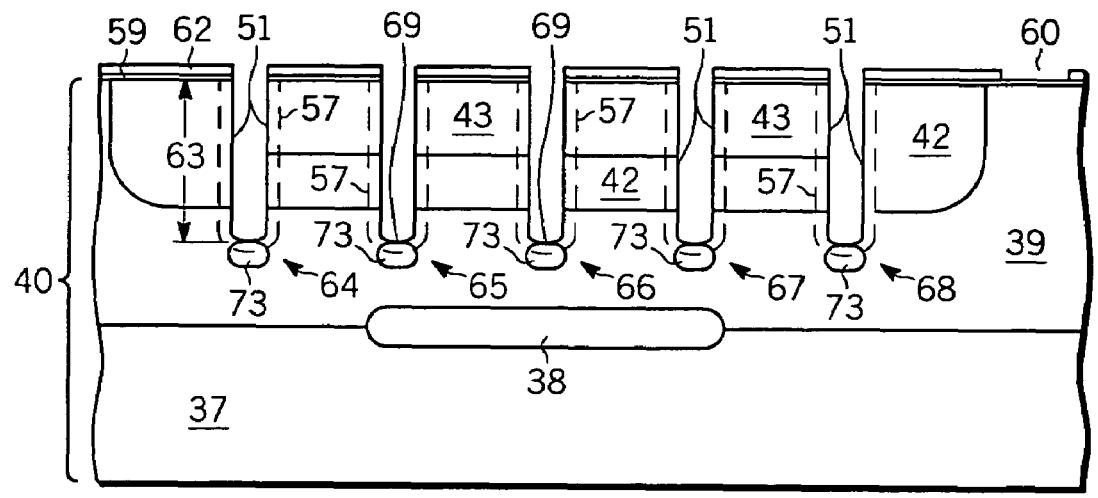
FIG. 5 through FIG. 12 illustrate enlarged cross-sectional portions of the MOS transistor of FIG. 1 illustrating portions of subsequent stages of embodiments of a method of forming the MOS transistor of FIG. 1 in accordance with the present invention.

FIG. 5 illustrates an enlarged cross-sectional view of a portion of transistor 20 at another subsequent stage of an embodiment of a method of forming transistor 20. A first protective layer 62 is formed on layer 59. As will be seen further hereinafter, protective layer 62 is used to assist in forming the first and second insulators of gates 45-49. Layer 62 may also assist in ensuring that the opening of trenches 64-68 near surface 41 is equal to or wider than the width of trenches 64-68 distal from the opening. Such a configuration facilitates subsequently forming conductor material within trenches 64-68. The material used for layer 62 is a material that restricts oxygen diffusion and therefore restricts oxidation of any layers under layer 62. Although layer 62 is shown as a single layer of material, it can also be a layered structure of different material types. Layers 59 and 62 preferably are silicon dioxide and a stack of silicon oxide over silicon nitride, respectively.

A mask (not shown) may be applied to layer 62 and patterned to have openings where trenches 64, 65, 66, 67, and 68 are to be formed. The openings in the mask are utilized to form openings through layer 62, through layer 59, and a depth 63 into substrate 40 thereby forming openings into substrate 40 for trenches 64, 65, 66, 67, and 68. Trenches 64-68 generally have sidewalls 51 that are approximately aligned with the edges of the opening through layers 59 and 62. Trenches 64-68 also have a bottom 69. As is well known in the art, the chemistries used to etch layers 62 and then 59 are usually different from the chemistries used to etch substrate 40. In the preferred embodiment, an anisotropic fluorine based RIE type of etch is used to etch layers 59 and 62. The openings within substrate 40 for trenches 64-68 may be formed by a variety of well-known techniques such as reactive ion etching (RIE) typically with chlorine or bromine chemistry or fluorine based techniques such as the Bosch process. In the preferred embodiment, depth 63 is greater than the depth of region 42.

One of the masks, not shown, used for forming trenches 64-68 may also be used to assist in forming an opening 60 through layer 62. Opening 60 will subsequently be utilized to form a field oxide 61 (FIG. 2). Although field oxide 61 generally surrounds transistor 21, only one portion of oxide 61 is illustrated for simplicity of the drawings. An optional doped region 73 may be formed in substrate 40 underlying bottom 69 of trenches 64-68 to assist in providing a low on-resistance for transistor 20. Region 73 generally is doped with the same dopant type as layer 39. The mask(s) is subsequently removed.

Sidewalls 51 and bottom 69 are then oxidized to form an oxide 57, illustrated by dashed lines, extending from the position of sidewalls 51 and bottom 69 into the material of substrate 40.

Figure 6:
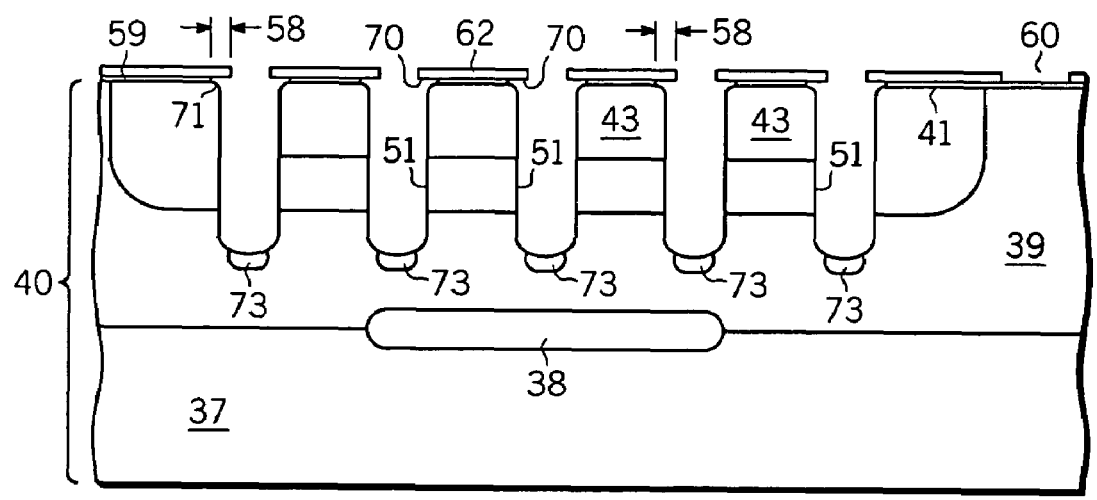

FIG. 6 illustrates another enlarged cross-sectional view of a portion of transistor 20 at another subsequent stage of an embodiment of a method of forming semiconductor transistor 20. Oxide 57 is removed thereby causing sidewalls 51 to be pulled-back or recessed under layer 62 and extending bottom 69 into substrate 40. The amount of the pull-back or recess usually is determined by the thickness of oxide 57 and the amount of oxide 57 that is removed. In the preferred embodiment, oxide 57 is formed to a thickness of about one hundred (100) nanometers on each sidewall 51 and bottom 69. All of oxide 57 is preferably removed resulting in sidewalls 51 being pulled-back approximately one-half of the thickness of oxide 57. During the removal of oxide 57 from sidewalls 51 and bottom 69, a portion of layer 59 is also removed from under layer 62 and adjacent to the opening through layer 62. Typically, the process to remove oxide 57 is preferential to oxide and follows the portion of layer 59 that is abutting oxide 57 (FIG. 5) and even extends a distance 58 along layer 59 and under layer 62. Distance 58 generally is greater than the thickness of oxide 57 and may be about one hundred (100) to one thousand (1000) nanometers, and preferably about one hundred fifty (150) nanometers.

Removing the portion of layer 59 also removes a portion of sidewalls 51 near surface 41 forming a portion of sidewalls 51 into shoulders 71 near or adjacent to and especially at the interface of sidewalls 51 and surface 41. Shoulders 71 form a non-orthogonal intersection with surface 41. The removal of the portion of layer 59 underlying layer 62 leaves a portion of layer 62 over-hanging the opening of trenches 64-68 as a ledge 70. Ledge 70 extends past sidewalls 51 and exposes an under surface or bottom surface of layer 62. The undercutting of layer 62 also forms the opening of trenches 64, 65, 66, 67, and 68 at surface 41 to be wider than the width of trenches 64, 65, 66, 67, and 68 along sidewalls 51 distal to the opening. The wide opening facilitates forming the remaining elements of trenches 64-68 including subsequently forming conductor 80 within trenches 64-68. Removing a portion of sidewalls 51 also assists in the formation of protective spacers at a later stage.

In other embodiments, the width of trenches 64-68 may be increased to extend underlying layer 59 and forming shoulder 71 by other techniques such as removing a portion of sidewalls 51 through an isotropic silicon etch (either wet or dry).

Figure 7:
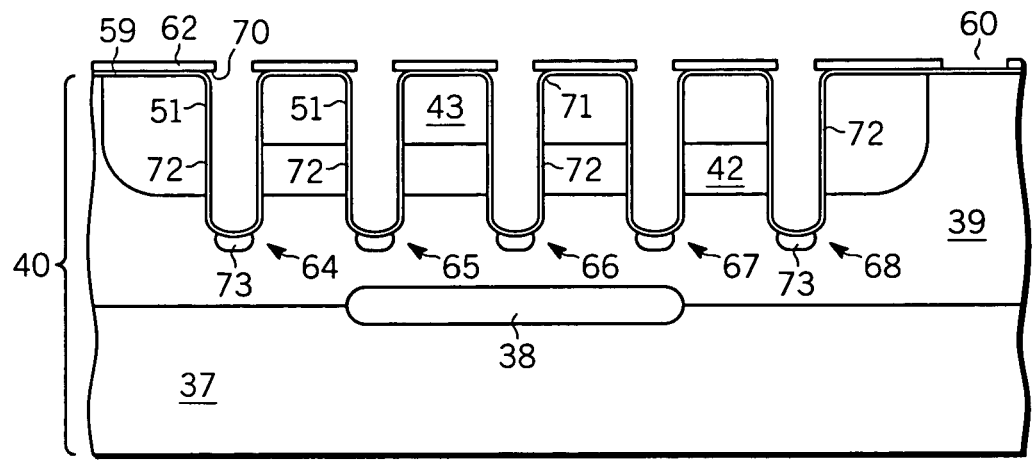

FIG. 7 illustrates an enlarged cross-sectional view of a portion of transistor 20 at another subsequent stage of an embodiment of a method of forming transistor 20. First silicon dioxide 72 is formed along sidewalls 51, including shoulders 71, and bottom 69. Oxide 72 typically extends from the bottom surface of ledge 70 along shoulders 71, sidewalls 51, and across bottom 69. Shoulders 71 assist in providing a low stress area for forming oxide 72 along shoulders 71 and at the top edge of trenches 64-68. In the preferred embodiment, a portion of oxide 72 that is formed along sidewalls 51 juxtaposed to region 43 will function as a gate oxide for transistor 21. Consequently, the thickness of oxide 72 is small, typically between about twenty (20) and one hundred (100) nanometers and preferably about sixty (60) nanometers. Oxide 72 may be formed by a variety of well-known techniques including dry oxidation or wet oxidation.

Figure 8:
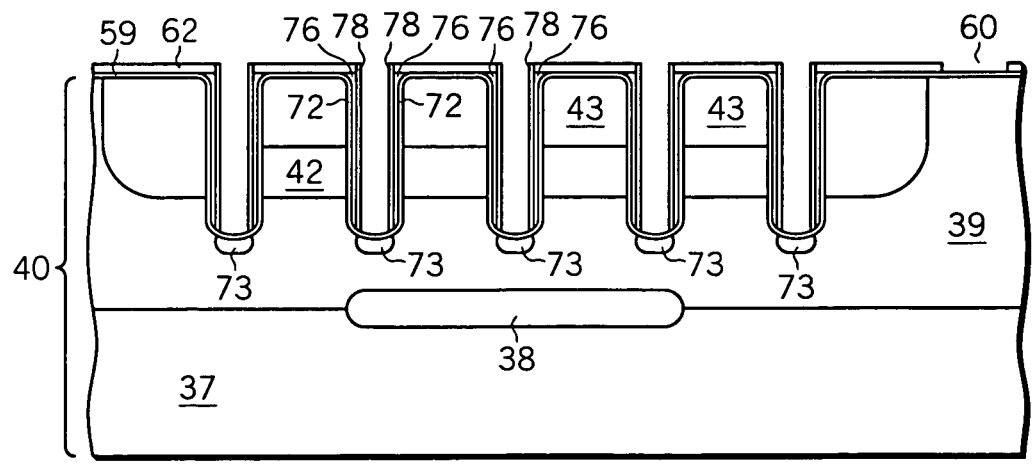

FIG. 8 illustrates an enlarged cross-sectional view of a portion of transistor 20 at still another subsequent stage of an embodiment of a method of forming transistor 20. In order to assist in subsequently forming a thick insulator along bottom 69, such as a thick silicon dioxide 79 (FIG. 2), without substantially increasing the stress or changing the thickness of oxide 72 along sidewalls 51, a polysilicon layer 76 is formed on oxide 72 including forming polysilicon layer 76 overlying shoulders 71, sidewalls 51, and bottom 69. In the preferred embodiment, a conformal layer of polysilicon is formed on layer 62 including on the edges of the opening through layer 62, on the bottom surface of ledge 70, and on oxide 72. Polysilicon layer 76 generally is formed to have a thickness of about twenty (20) to one hundred (100) nanometers and preferably is deposited to a thickness of about fifty (50) nanometers.

Thereafter, the non-vertical portion of layer 76 overlying protective layer 62, the portion on the edges of ledge 70, and the portion on bottom 69 are removed to expose at least a portion of oxide 72 along bottom 69. Preferably, an amount of layer 76 is removed to ensure that the portion of layer 76 on sidewalls 51 and shoulders 71 extend away from oxide 72 no greater than the edge of ledge 70. As illustrated in FIG. 8, layer 76 remains on the portion of oxide 72 underlying ledge 70 thereby covering all of oxide 72 except the portion on bottom 69. Dashed lines illustrate the portion of layer 76 that is removed from bottom 69. Generally, the portion of layer 76 is removed by an anisotropic reactive ion etch that leaves layer 76 on the portion of oxide 72 that is on sidewalls 51 including shoulders 71.

A second protective layer 78 is formed on layer 76 and the exposed portion of oxide 72 along bottom 69. Layer 78 generally is formed from the same material as layer 62. A line illustrates the transition between layer 62 and layer 78. Recessing layer 76 below the sidewall of ledge 70 forms a substantially flat surface of layer 62 that is void of layer 76 on which to form layer 78. Without the step of recessing layer 76 under ledge 70, layer 78 may not be formed on the sidewall of layer 62, thus, the exposed portion of layer 78 and the top portion of oxide 72 would be exposed to subsequent processing operations. The non-vertical portions of layer 78 are removed to expose at least a portion of oxide 72 along bottom 69. The portions of layer 78 may be removed by operations generally referred to as an anisotropic spacer etch. For example, the portions of layer 78 may be removed by an RIE etch that is timed to ensure that all of the non-vertical portions of layer 78 overlying bottom 69 are removed. In the preferred embodiment, the etch to remove the portions of layer 78 is timed to remove approximately fifty percent more material than is expected to be along bottom 69. For example, if layer 78 is formed to a thickness of about fifty (50) nanometers, the removal etch is timed to remove about seventy-five (75) nanometers.

Figure 9:
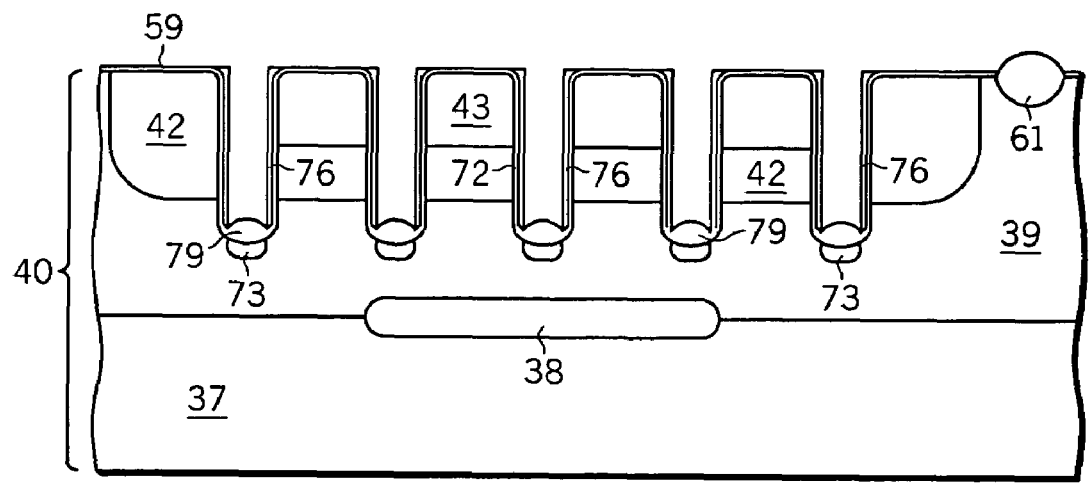

FIG. 9 illustrates an enlarged cross-sectional view of a portion of transistor 20 at another subsequent stage of an embodiment of a method of forming transistor 20. The thickness of oxide 72 along a portion of bottom 69 is increased to form thick silicon dioxide 79 in the bottom of trenches 64-68. The thickness of thick silicon dioxide 79 is formed without substantially increasing or changing the first thickness of oxide 72 that is along sidewalls 51 especially the thickness juxtaposed to regions 43. Silicon dioxide 79 usually is formed by further oxidation of the material exposed within trenches 64-68. The remaining portions of layers 78 and 76 protect oxide 72 that is on sidewalls 51. In the preferred embodiment, a wet oxidation with a hydrogen source is used to form silicon dioxide 79. In the preferred embodiment, the thickness generally is increased by approximately two hundred nanometers to a total thickness of approximately two hundred thirty (230) nanometers, but may be increased more or less in other embodiments. In this preferred embodiment, the wet oxidation is performed at approximately one thousand (1000) degrees Celsius. Forming protective layer 78 (FIG. 8) and layer 76 covering oxide 72 along sidewalls 51, including shoulders 71, functions like a poly buffered locos that facilitates forming silicon dioxide 79 very thick without creating stresses or dislocations at the bottom of trenches 64-68. During the formation of silicon dioxide 79, field oxide 61 may be formed in opening 60.

Layers 62 and 78 (FIG. 8) are removed leaving layer 76 to protect oxide 72. Layers 62 and 78 may be removed by a variety of well-known techniques and preferably are removed by a wet nitride stripping operation such as a hot phosphoric acid removal.

Figure 10:
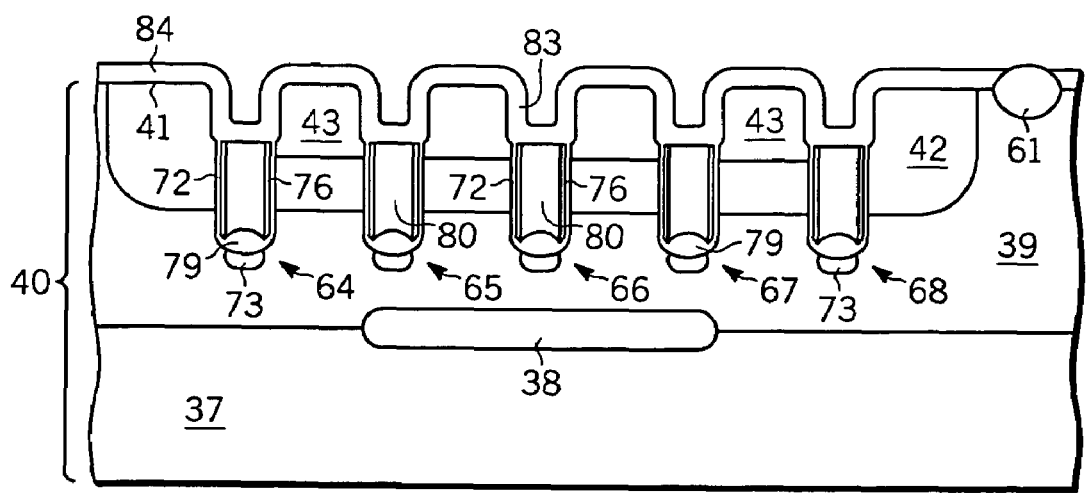

FIG. 10 illustrates an enlarged cross-sectional view of a portion of transistor 20 at another subsequent stage of an embodiment of a method of forming transistor 20. Conductor 80 is formed within trenches 64-68. Conductor 80 generally is formed by applying a conformal coating of a doped polysilicon that fills trenches 64-68. Thereafter, the polysilicon is etched to remove a portion of the polysilicon and leave another portion as conductor 80 filling the trenches to a depth at least substantially equal to the depth of the bottom of region 43 so that the top of conductor 80 is no deeper than substantially the top of region 42 within the active region of transistor 21 and may be closer to surface 41. The active region generally is the portion of region 42 between gates 45-49 (see FIG. 2). Some of the active regions are pointed out in general by regions 52-54 (see FIG. 2). The goal is to make sure that the top of conductor 80 is closer to surface 41 than the bottom of region 43 is to surface 41 so that oxide 72 may be used as the gate dielectric for gates 45-49. For example, it is desirable to ensure that the top of conductor 80 extends across the junction formed at the interface of regions 42 and 43. However, those skilled in the art realize there are always minor variances, such as process variations, such that some portions of conductor 80 may be deeper than the top of region 42 within the active region. Removing a portion of the polysilicon and leaving conductor 80 also removes the exposed portions of the polysilicon of layer 76. Those skilled in the art will appreciate that conductor 80 may a variety of other well know conductor materials such as WSi, W or other low resistance conductors. For the case where conductor 80 is formed from polysilicon, the polysilicon surface may be used to form a silicide or other similar well-known conductor. Alternately, conductor 80 may be formed as doped polysilicon surrounding a silicide core. For example, a portion of conductor 80 could be formed using chemical vapor deposition (CVD). After the first portion of conductor 80 was formed, the remainder may be formed as a silicide resulting in a structure for conductor 80 having a silicide core surrounded by polysilicon.

Thereafter, second oxide 83 is formed on the exposed portions of oxide 72 to a thickness that is greater than the thickness of oxide 72. Oxide 83 may also be formed on surface 41, as an insulator 84, and on the top of conductor 80. Oxide 83 typically is no deeper than, and preferably is not as deep as, the P-N junction formed at the interface between regions 42 and 43. Such a depth ensures that the insulator in the active gate region of transistor 21 remains thin. Oxides 83 and insulator 84 may be formed by a variety of well-known methods including thermal oxidation of the exposed silicon, CVD deposition, or other well-known techniques.

Figure 11:
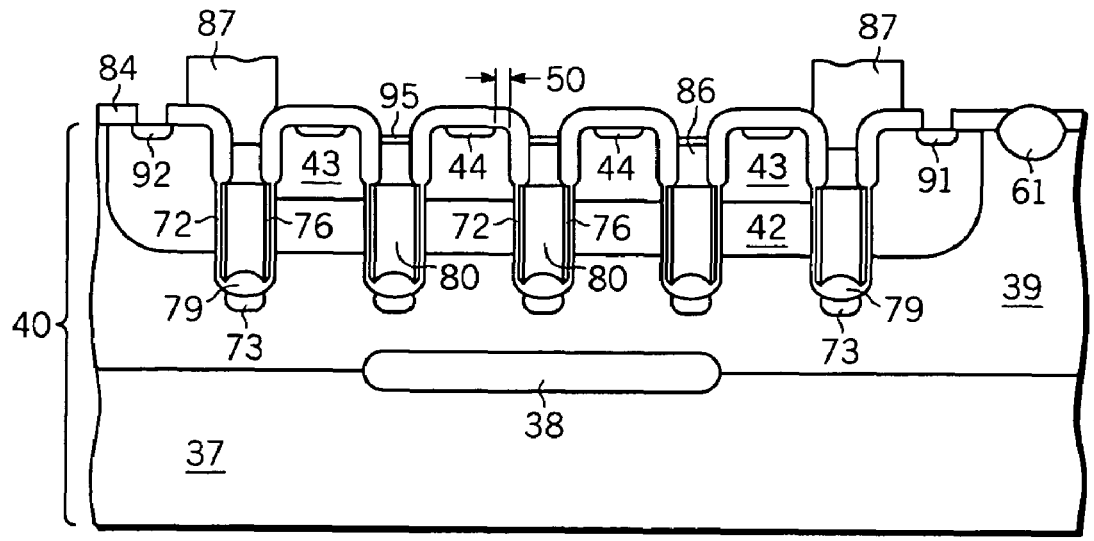

FIG. 11 illustrates an enlarged cross-sectional view of a portion of transistor 20 at yet another subsequent stage of an embodiment of a method of forming semiconductor transistor 20. The portion of oxide 83 overlying conductor 80 is removed to facilitate forming electrical contact to conductor 80. Another conductor 86 is formed within the remaining opening of trenches 64-68 to form electrical contact to conductor 80. Conductor 86 may be doped polysilicon, a metal conductor, a metal silicide, a metal salicide, or the like. Conductor 86 reduces the gate resistance of transistor 21. Conductor 86 may be formed by a variety of methods including forming a conformal coating of doped polysilicon and removing portions of the conformal coating to leave conductor 86. In some of the trenches, such as trenches 64 and 68, the conformal coating may be patterned to leave conductors 87 electrically connected to conductor 80. Conductors 87 are an option and may not be present in all embodiments.

Insulator 95 generally is formed at least on conductor 80 that is within the trenches within the active region of transistor 21 such as illustrated in trenches 65-67. As is well known to those skilled in the art, trenches 64-68 and conductors 80 and 86 therein generally are extended laterally across surface 41, such as out of the page illustrated in FIG. 11, to facilitate forming electrical contact to conductors 80 and 86.

In another embodiment of a method of forming conductor 80 and conductor 86, a first conductor, such as conductor 80 formed as doped polysilicon, is formed within an opening, such as trench 66, adjacent to a dielectric, such as oxide 72. Thereafter, such as after forming oxide 83, a second conductor, such as a metal-silicon alloy, maybe formed as a core that extends within the first conductor. For such a case, the second conductor generally has a lower resistivity than the first conductor. Such a configuration could reduce the gate resistance. In addition, a metal-silicon alloy could also be formed on the top surface of the first conductor to further reduce the gate resistance.

Doped regions 44 are formed within region 43 to assist in forming a low resistance electrical contact to the first current carrying electrode of transistor 21.

Doped regions 91 and 92 may also be formed on surface 41. A mask is applied to expose a portion of insulator 84. The exposed portion of insulator 84 is removed to expose a portion of surface 41.

Figure 12:
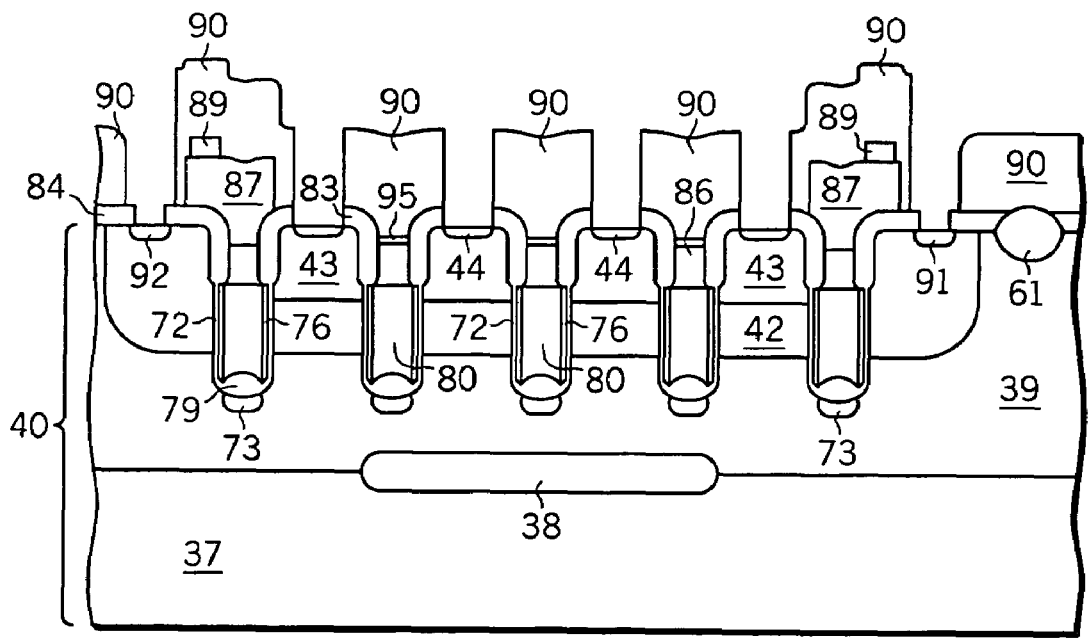

FIG. 12 illustrates an enlarged cross-sectional view of a portion of transistor 20 at yet another subsequent stage of an embodiment of a method of forming transistor 20. In some embodiments, an optional conductor 89 may be formed on a portion of optional conductors 87. A dielectric 90, such as an inner-layer dielectric, is formed on substrate 40. Openings are formed in insulator 84 and dielectric 90 to expose regions 44, 91, and 92.

Referring back to FIG. 2, a conductor material is formed within the openings within dielectric 90. The conductor material may be a variety of well know conductor materials including aluminum, aluminum-silicon, polysilicon, WSi, W, or combinations of conductive materials. In the preferred embodiment, a blanket layer of conductor material is applied and patterned to form conductors 119, 120, 121, 125, and 126. Conductor 120 is formed to make electrical contact to region 93 and to the drain of transistor 29 through an electrical contact to region 103. A portion of dielectric 90 insulates conductor 120 from portions of the surface of substrate 40. Conductor 120 connects the drain of transistor 29 to CCE2 of transistor 21. Conductor 121 is formed to make electrical contact to region 42 through region 92 and to region 105 in order to connect body 22 to the source of transistor 29. Another portion of dielectric 90 insulates conductor 121 from portions of the surface of substrate 40. Conductor 119 extends to overlie and make electrical contact to all regions 44 in order to form CCE1 of transistor 21. Other portions of dielectric 90 insulate conductor 119 from gates 45-49. Conductor 125 is formed to make electrical contact to region 91 and regions 113 and 114 in order to form an electrical contact between body 22 and the source of transistor 27. Another portion of dielectric 90 insulates conductor 125 from other portions of transistors 21 and 27. Conductor 126 is formed to make electrical contact to region 112 in order to form an electrical connection to the source of transistor 27. A portion of conductor 126 may extend across substrate 40 in order to electrically connect conductor 126 to conductor 119, thus to CCE1, and to the gate of transistor 29. Additionally, a portion of conductor 120 may extend across substrate 40 in order to connect the drain of transistor 29 to the gate of transistor 27. It will be appreciated by those skilled in the art that using multiple metal layers to assist in forming the connections between portions of transistor 20 would simplify the connections.

One skilled in the art will appreciate from the foregoing descriptions and FIGS. 1-12, that body 22 of transistor 21, which is formed by region 42, has an electrical contact through regions 91 and 92 that is separate from the electrical contact that is made to CCE1 of region 43 through region 44. Body 22 has a separate electrical connection to conductors 121 and 125 and is not connected to CCE1 by conductor 119. Separating the electrical contact to the body from the electrical contact to CCE1 or to the source assists in the bi-directional current conduction through transistor 21 under the control of gates 45-49 without forcing current to flow through body diodes 23 and 24.

Figure 13:
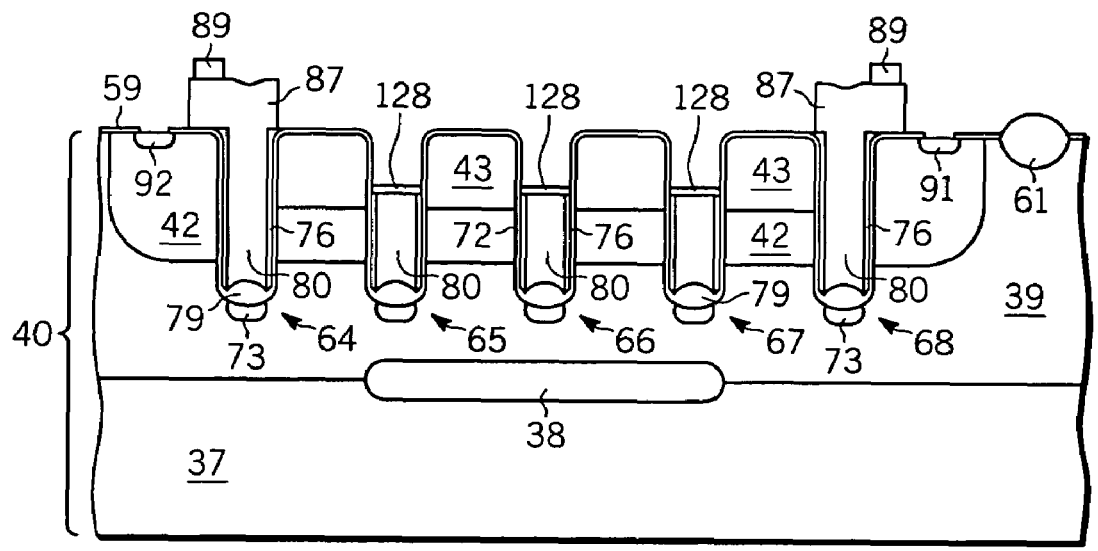
FIG. 13 and FIG. 14 illustrate enlarged cross-sectional portions of the MOS transistor of FIG. 1 illustrating portions of some stages of an alternate embodiment of a method of forming some portions of the MOS transistor of FIG. 1 in accordance with the present invention.
Figure 14:
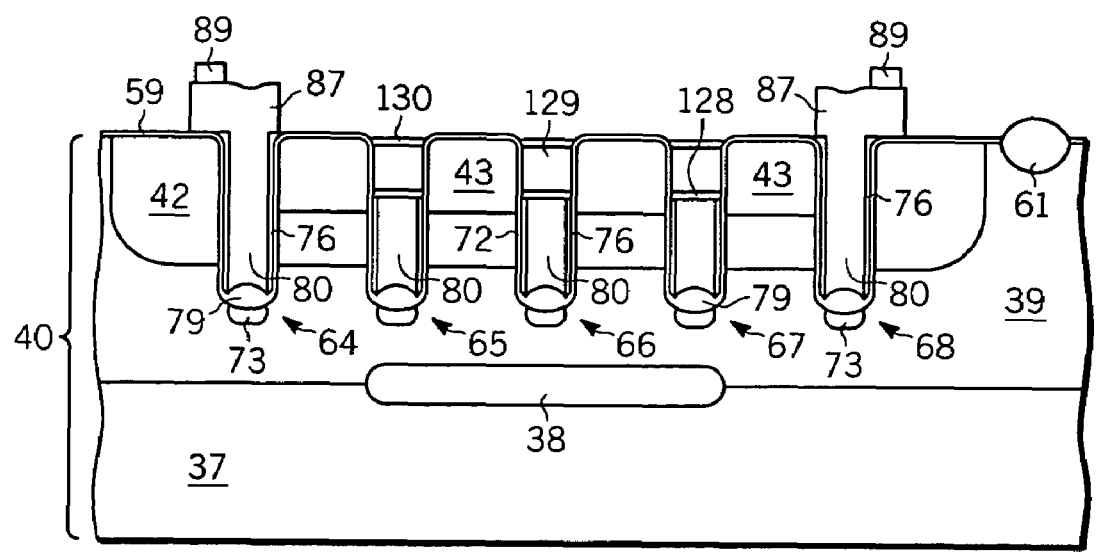

FIG. 13 and FIG. 14 illustrate an enlarged cross-sectional view of a portion of transistor 20 according to some stages of an alternate embodiment of a method of forming transistor 20 including alternate methods for forming the second insulator of at least gates 45-49. This description begins in general after performing the steps described relating to the description of FIG. 9.

Subsequent to removing the non-vertical portion of layers 62 and 78 as described relating to the description of FIG. 8, optional third insulator, such as a silicon dioxide 79, may be formed as described relating to the description of FIG. 9. Conductor 80 is formed within trenches 64-68. As described hereinbefore, conductor 80 generally is formed by applying a conformal coating of doped polysilicon that fills trenches 64-68. Thereafter, the polysilicon is etched to remove a portion of the polysilicon and leave another portion as conductor 80 filling the trenches to a depth at least substantially equal to the depth of the bottom of region 43 so that the top of conductor 80 is no deeper than substantially the top of region 42 within the active region of transistor 21 (for example, between trenches 64-68). In some embodiments, the conductor material within some of the trenches, such as trenches 64 and 68, optionally may be patterned to form conductors 87. Thereafter a protective layer 128 may be formed over conductor 80 that is in trenches 65-67 to protect conductor 80. Protective layer 128 generally is an insulator such as silicon dioxide but may be other insulators such as silicon nitride.

Referring to FIG. 14, an insulator 129 may be formed within trenches 65-67 and overlying conductor 80. Insulator 129 may be a variety of dielectric materials including silicon dioxide, silicon nitride, or other well-known dielectric materials. Another protective layer 130 may be formed on insulator 129 in order to reduce stresses within transistor 20. Note that for the case of insulator 129 being silicon nitride, layer 128 may also assist in reducing stresses within transistor 20. Protective layers 128 and 130 are optional and may be omitted in some embodiments. For example, layer 128 and insulator 129 may be silicon dioxide formed as a portion of dielectric 90. For such an embodiment, layers 128 and 130 may not be used. Insulator 129, and optional layers 128 and 130, are positioned in general along the sidewalls of trenches 65-67 and form a thick insulator for the second insulator of transistor 20. Oxide 72 plus insulator 129 form the second insulator along the sidewalls of the trenches juxtaposed to region 43 that has a thickness greater than the thickness of the portion of oxide 72 that is juxtaposed to region 42. Using silicon nitride for insulator 129 further increases the dielectric constant for the second insulator. Thereafter, the remaining portions of transistor 21 may be formed as described hereinbefore.

In another embodiment, insulator 129 may not be formed, but may be replaced with a semiconductor material such as polysilicon. For such an embodiment, layer 128 may be formed by an oxidization of conductor 80 or by other methods. Subsequently, a semiconductor material such as doped or undoped polysilicon may be formed on layer 128. For example, the semiconductor material may be formed during the formation of a gate conductor of other MOS transistors, such as transistors 27 and 29, that are positioned on other sections of substrate 40.

Figure 15:
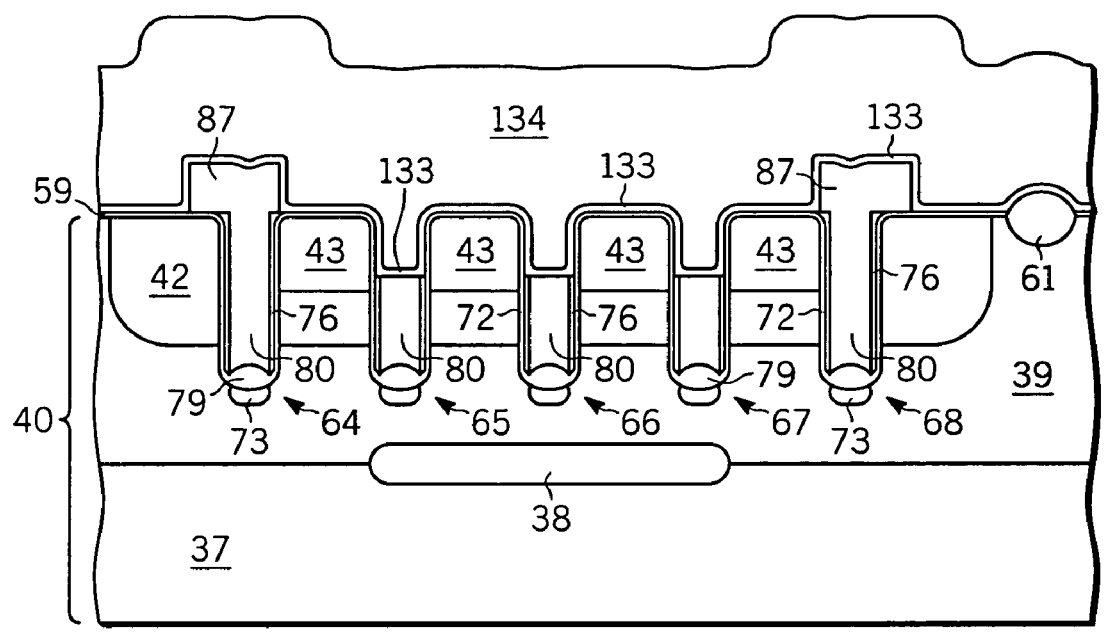
FIG. 15 and FIG. 16 illustrate enlarged cross-sectional portions of the MOS transistor of FIG. 1 illustrating portions of some stages of another alternate embodiment of a method of forming some portions of the MOS transistor of FIG. 1 in accordance with the present invention.
Figure 16:
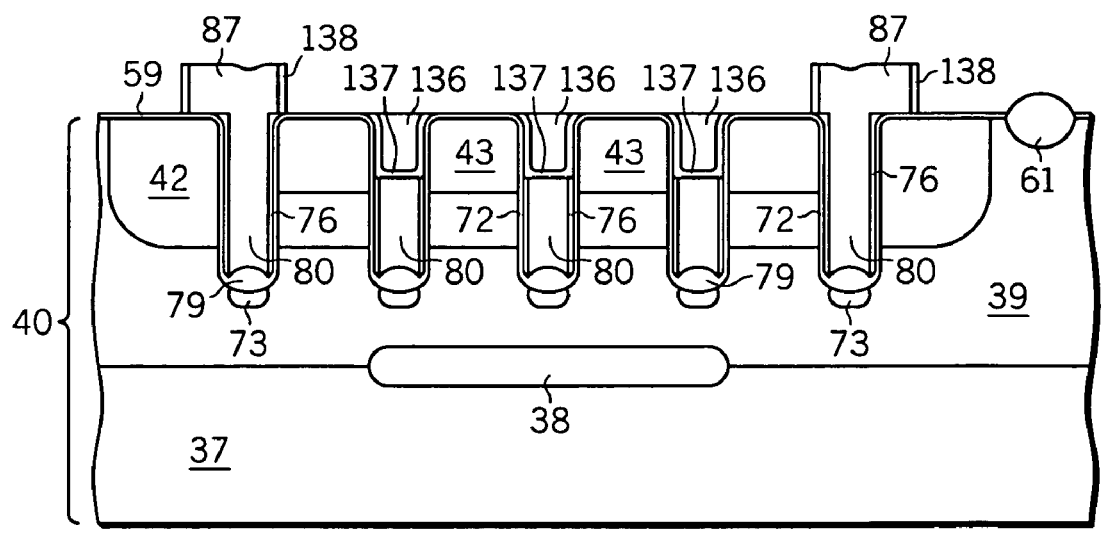

FIG. 15 and FIG. 16 illustrate an enlarged cross-sectional view of a portion of transistor 20 according to some stages of another alternate embodiment of a method of forming transistor 20 including alternate methods for forming the second insulator of at least gates 45-49. This description begins in general after performing the steps described relating to the description of FIG. 9.

Subsequent to removing the non-vertical portion of layers 62 and 78 as described relating to the description of FIG. 8, optional silicon dioxide 79 may be formed as described relating to the description of FIG. 9. Conductor 80 is formed within trenches 64-68. As described hereinbefore, conductor 80 generally is formed by applying a conformal coating of doped polysilicon that fills trenches 64-68. Thereafter, the polysilicon is etched to remove a portion of the polysilicon and leave another portion as conductor 80 filling the trenches to a depth at least substantially equal to the depth of the bottom of region 43 so that the top of conductor 80 is no deeper than substantially the P-N junction at the interface of regions 42 and 43. In some embodiments, the conductor material within some of the trenches, such as trenches 64 and 68, may be patterned to form conductors 87.

A silicon nitride layer 133 may be formed over conductor 80 that is at least in trenches 65-67. Layer 133 generally is formed by applying a blanket layer of silicon nitride. The thickness of layer 133 generally is much less than the remaining depth of trenches 65-67. Thereafter, a dielectric layer 134 may be applied covering layer 133 and filling the remainder of the opening of trenches 65-67. The material used for layer 134 preferably is a material that is not etched by methods that etch layer 133 and a material that can be etched by methods that do not etch layer 133. The material used for layer 134 may be silicon dioxide or a variety of other well-known dielectrics. For example, layer 134 may be formed by applying a blanket layer of TEOS.

Referring to FIG. 16, thereafter, portions of layer 134 are removed leaving other portions of layer 134 within trenches 65-67 as a dielectric filler 136. Preferably, the portions of layer 134 are removed by an anisotropic etch that removes the horizontal features and leaves the vertical portions of layer 134 as spacers 138. Such an etch is terminated after underlying layer 133 is exposed thereby leaving the portions of layer 134 within trenches 65-67 to fill trenches 65-67. Subsequently, the exposed portions of layer 133 are removed leaving other portions of layer 133 underlying dielectric filler 136 as a nitride liner 137. The exposed portions of layer 133 may be removed by a wet nitride stripping etch that does not etch the material of filler 136. Dielectric filler 136 may also be formed as a portion of dielectric 90 or as another dielectric. For example, filler 136 may be formed by applying a blanket layer of the dielectric material and removing the portions external to trenches 65-67 or a mask may be used to selectively form filler 136. Oxide 72 plus liner 137 and dielectric filler 136 form the second insulator along the sidewalls of the trenches juxtaposed to region 43 that has a thickness greater than the thickness of oxide 72 that is juxtaposed to region 42. Also, forming dielectric filler 136 leaves a relative flat surface on which other MOS devices may be formed. In addition, dielectric filler 136 assists in reducing field effects in the top regions of the gates of transistor 20. Those skilled in the art will appreciate that conductor 80 may formed with a silicide core as explained in the description of FIG. 10 in order to reduce the gate resistance of transistor 20.

Figure 17:
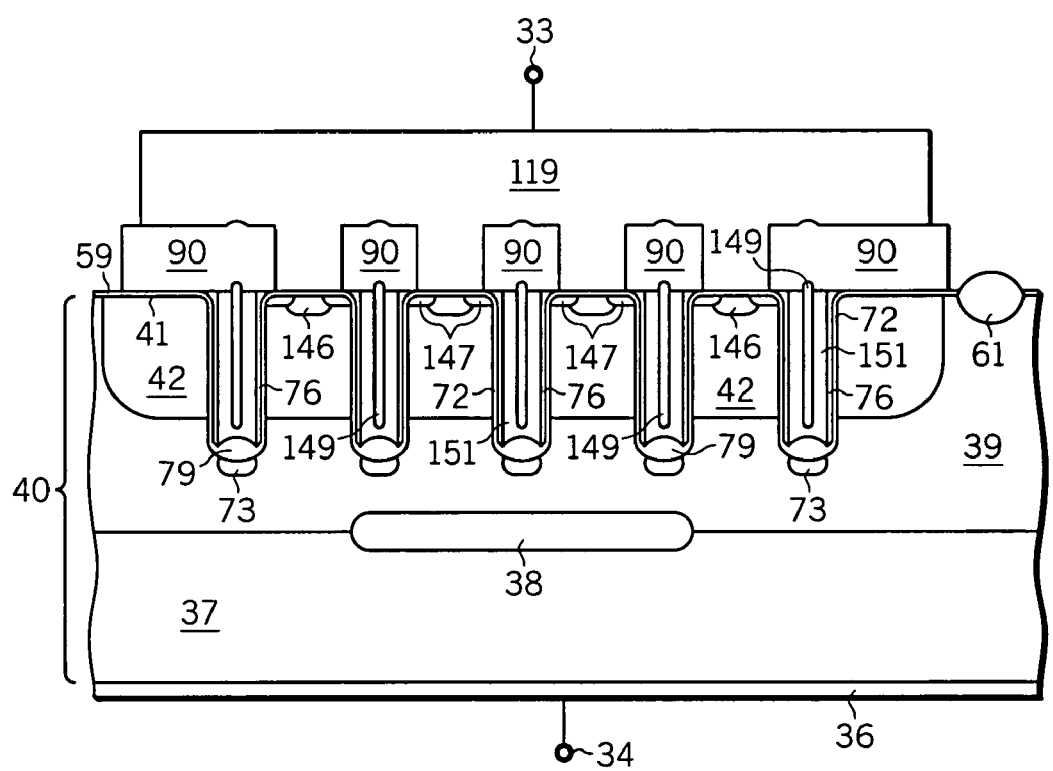
FIG. 17 illustrates a cross-sectional portion of another MOS transistor at a stage of a method of forming the MOS transistor in accordance with the present invention.

FIG. 17 illustrates a cross-sectional portion of an embodiment of another MOS transistor 145 at a stage of a method of forming transistor 145. Transistor 145 generally is a vertical trench-type MOS transistor that is similar to transistor 20, however, transistor 145 does not include region 43, and the body of transistor 145 is connected to the source. Transistor 145 may be formed similarly to transistor 20 up to the point of forming conductor 80 as described relating to the description of FIG. 9. However, instead of forming region 43, region 42 is formed to extend all the way to surface 41 without region 43.

A first conductor 151 is formed within trenches 64-68. A second conductor 149 is formed to extend into conductor 151 so that conductor 151 is between conductor 149 and oxide 72. Conductor 151 is similar to conductor 80 and generally is formed from the same conductor materials as conductor 80. However, conductor 151 typically fills trenches 64-68 to a level that is close to surface 41 or even substantially the same as surface 41 instead of filling the trenches to the depth that is used for conductor 80. Second conductor 149 is a conductor that has a lower resistivity than the material used for conductor 151. Conductor 149 preferably is a metal-silicon alloy such as tungsten-silicon ($WSi_2$), titanium-silicon ($TiSi_2$), platinum-silicon (PtSi), or aluminum-silicon (AlSi), but may be another conductor material that has lower resistivity than the material of conductor 151. Such a configuration reduces the gate resistance of transistor 145. Conductor 151 may be formed by applying a thin layer of doped polysilicon that coats the sidewalls and bottoms of trenches 64-68 but leaves an opening in the middle of the trenches. Conductor 149 is formed to fill the remainder of the opening in the trenches. For example, metal-silicon alloy, such as WSi, may be deposited to fill the remainder of the opening. Alternately, a metal may be deposited and later annealed to form the metal-silicon alloy. In another method of forming conductor 149, conductor 151 may be omitted. Because of the previous formation of layer 76, a thin polysilicon layer generally is on oxide 72. In such a case, the remainder of the trench may be filled with a metal-silicon alloy to form the second conductor while layer 76 forms the first conductor. Polysilicon layer 76 generally is sufficiently thick to prevent the metal-silicon alloy from adversely affecting the work-function of the resulting gate of transistor 145. Depositing the metal-silicon alloy or the metal may be performed by well-known methods such as a chemical vapor deposition (CVD) process. The methods of forming conductors 149 and 151 generally also form such conductors on layer 59. The portions of conductors 149 and 151 on layer 59 are removed leaving conductors 149 and 151 within the trenches. Typically, the portions of conductor 149 are first removed, such as with a fluorine/chlorine chemistry. As the portions of conductor 149 are removed, the chemistry may be changed, such as to a bromine/chlorine chemistry, to etch the portions of conductor 151 from layer 59. The chemistries used to remove the portions of conductors 149 and 151 generally is more aggressive toward the material of conductor 151 which may leave a tip of conductor 149 extending past the surface of conductor 151.

A metal-silicon alloy (not shown) could also be formed on the top surface of conductor 151 to further reduce the gate resistance. Subsequently, doped regions 147 are formed on substrate 40 to function as the sources for transistor 145. A doped region 146 is formed to extend through the sources of regions 147 into region 42 to function as a body contact region for transistor 145. Subsequently, dielectric 90 is formed on conductors 149 and 151 to insulate them from other elements of transistor 145. Thereafter, openings are formed through dielectric 90 and layer 59 to expose regions 146 and 147. Conductor 119 is formed to electrically contact the sources of regions 147 and the body of transistor 145 through regions 146. Those skilled in the art will appreciate that the gate structures that include conductors 149 and 151 typically extend across substrate 40 so that contact may be formed thereto at a point outside of the active region of transistor 145.

In view of all of the above, it is evident that a novel device and method is disclosed. Included, among other features, is selectively forming the nHV region underlying the region for the first current carrying electrode (CCE1) facilitates sustaining high reverse voltages across transistor 20. Forming the second insulator thicker than the first insulator facilitates the transistor having a high reverse breakdown voltage while still having a low gate-to-source/drain capacitance and a low on-resistance.

While the subject matter of the invention is described with specific preferred embodiments, it is evident that many alternatives and variations will be apparent to those skilled in the semiconductor arts. Although the method of forming transistor 21 is explained relative to forming a bi-directional transistor, the method is also applicable to forming uni-directional transistors. Those of average skill in the art will appreciate that the illustrated steps constitute only a portion of the manufacturing process steps required to form transistor 20. Additionally, the word "connected" is used throughout for clarity of the description, however, it is intended to have the same meaning as the word "coupled". Accordingly, "connected" should be interpreted as including either a direct connection or an indirect connection.

The invention claimed is:
1. A method of forming an MOS transistor comprising:
   providing a substrate having a first conductivity type and having a first surface;
   forming a first doped region of a second conductivity type within at least a portion of the substrate and having a first peak doping concentration;

forming a second doped region of the first conductivity type overlying at least a portion of the first doped region and having a second peak doping that is no greater than the first peak doping concentration;

forming a third doped region of the first conductivity type overlying at least a portion of the second doped region and having a third peak doping concentration that is greater than the second peak doping concentration; and forming an opening into the substrate with the opening having a sidewall juxtaposed to the first doped region and the second doped region.

2. The method of claim 1 further including forming a first insulator having a first thickness along at least a first portion of the sidewall juxtaposed to the first doped region, and forming a second insulator having a second thickness along at least a second portion of the sidewall juxtaposed to the second doped region wherein the second thickness is greater than the first thickness.

3. The method of claim 1 wherein forming the third doped region of the first conductivity type overlying at least the portion of the second doped region includes forming the third doped region spaced a first distance from the opening.

4. The method of claim 1 further including forming the MOS transistor having a first blocking junction that blocks voltage applied in a first direction across the MOS transistor and a second blocking junction that blocks voltages applied in a second direction across the MOS transistor.

5. The method of claim 1 wherein forming the second doped region includes forming the second peak doping concentration less than the first peak doping concentration.

6. The method of claim 5 further including forming the second peak doping concentration no greater than approximately 5E17 atoms/cm$^3$.

7. The method of claim 5 wherein forming the third doped region includes forming the third peak doping concentration greater than the first peak doping concentration and the second peak doping concentration.

8. The method of claim 7 wherein forming the third doped region includes forming the third peak doping concentration no less than approximately 1E18 atoms/cm$^3$.

9. A method of forming an MOS transistor comprising:
forming a channel region having a first conductivity type and having a first peak doping concentration;
forming a current carrying region of a second conductivity type overlying the channel region and having a second peak doping concentration that is no greater than the first peak doping concentration;
forming a first doped region overlying the current carrying region and having a third peak doping concentration; and forming a trench gate structure having a first insulator of a first thickness juxtaposed to the channel region and having a second insulator of a greater thickness juxtaposed to a portion of the current carrying region.

10. The method of claim 9 wherein forming the trench gate structure includes forming the second insulator as a layer of a first dielectric along a sidewall of an opening within a semiconductor substrate and forming a second dielectric on the first dielectric.

11. The method of claim 9 wherein forming the trench gate structure includes forming a first dielectric along a sidewall of an opening within a semiconductor substrate and increasing a thickness of the first dielectric along a second portion of the sidewall that is juxtaposed to the current carrying region.

12. The method of claim 9 further including forming a first conductor of a first resistivity within the trench gate structure and adjacent to the first insulator, and forming a second conductor of a second resistivity within the first conductor wherein the second resistivity is less than the first resistivity.

13. The method of claim 9 wherein forming the current carrying region includes forming the second peak doping concentration of the current carrying region to have a lower doping concentration than the third peak doping concentration of the first doped region and the first peak doping concentration of the channel region.

14. A method of forming an MOS transistor comprising:
providing a semiconductor substrate of a first conductivity type having a first surface;
forming a channel region of a second conductivity type on the first surface;
forming a current carrying region of the first conductivity type overlying the channel region;
forming a trench gate structure extending from the first surface into the channel region and having a insulator of a first thickness juxtaposed to the channel region;
forming a first conductor within the trench gate structure adjacent to the insulator; and
forming a second conductor within the trench gate structure electrically connected to the first conductor wherein the second conductor has a lower resistivity than the first conductor.

15. The method of claim 14 wherein forming the first conductor includes forming a conductor comprising silicon.

16. The method of claim 14 wherein forming the second conductor includes forming a metal-silicon alloy.

* * * * *

UNITED STATES PATENT AND TRADEMARK OFFICE
CERTIFICATE OF CORRECTION

PATENT NO. : 7,282,406 B2
APPLICATION NO. : 11/367627
DATED : October 16, 2007
INVENTOR(S) : Gordon M. Grivna et al.

It is certified that error appears in the above-identified patent and that said Letters Patent is hereby corrected as shown below:

Title Page, correct the spelling of the Assignee to read as follows:

(73) Assignee: Semiconductor Components Industries, L.L.C., Phoenix, AZ (US)

Signed and Sealed this

Eighteenth Day of March, 2008

JON W. DUDAS
*Director of the United States Patent and Trademark Office*